United States Patent [19]

De Doncker

[11] Patent Number: 5,684,426

[45] Date of Patent: Nov. 4, 1997

[54] GTO GATE DRIVER CIRCUITS FOR SNUBBERED AND ZERO VOLTAGE SOFT SWITCHING CONVERTERS

[75] Inventor: Rik Wivina Anna Adelson De Doncker, Malvern, Pa.

[73] Assignee: General Electric Company, Schenectady, N.Y.

[21] Appl. No.: 576,250

[22] Filed: Dec. 21, 1995

[51] Int. Cl.[6] .................................................. H03K 17/72
[52] U.S. Cl. .......................... 327/440; 327/442; 327/443
[58] Field of Search ................................. 327/438, 444, 327/440, 447, 441, 448, 442, 443

[56] References Cited

U.S. PATENT DOCUMENTS

| | | | |
|---|---|---|---|
| 3,928,775 | 12/1975 | Steigerwad | 307/252 |
| 3,940,633 | 2/1976 | Steigerwald | 307/252 |
| 4,231,083 | 10/1980 | Matsuda et al. | 327/443 |
| 4,298,809 | 11/1981 | Onda et al. | 327/442 |
| 4,597,038 | 6/1986 | Stacey | 327/440 |
| 5,027,264 | 6/1991 | De Doncker et al. | 363/16 |
| 5,047,913 | 9/1991 | De Doncker et al. | 363/95 |
| 5,077,487 | 12/1991 | Iida | 327/443 |
| 5,166,549 | 11/1992 | De Doncker | 307/354 |
| 5,444,273 | 8/1995 | Ueno | 257/138 |
| 5,486,752 | 1/1996 | Hva et al. | 323/222 |
| 5,504,449 | 4/1996 | Prentice | 327/427 |

OTHER PUBLICATIONS

"Further Refinements to an Optimum Gate Drive for High Power GTO Thyristors" by P. Szilagi, et al, PCC–Yokoyama '93, 1993 IEEE, pp. 44–48.

"Characteristifs of a 200 AMP GTE Turn–Off Thyristor" by E.D. Wooley, et al, IEEE Conference Record of 1973 8th Annual Meeting of the IEEE Industry Applications Society, pp. 251–257.

"Application Techniques for High Power Gate Turn–Off Thyristors" by R.L. Steigerald, Conference Record 1975 IAS Annual Meeting, IEEE Industry Applications Society, pp. 165–174.

"Thyristors" Power Electronics Circuits, Devices and Applications by M.H. Rashid, Chap 14, Sec 14–3, pp. 471–484.

Primary Examiner—Timothy P. Callahan
Assistant Examiner—Jeffrey Zweizig
Attorney, Agent, or Firm—Ann M. Agosti; Marvin Snyder

[57] ABSTRACT

A GTO gate driver circuit includes a GTO; a MOS gate driver; a turn-on rectifier for receiving power from a high voltage isolation transformer; a turn-on capacitor coupled in parallel with the turn-on rectifier; and a turn-on MOSFET having a drain coupled to a first side of the turn-on capacitor, a gate coupled to the MOS gate driver, and a source coupled to a gate of the GTO. In one embodiment the circuit includes a turn-off rectifier coupled to the turn-on rectifier; a turn-off capacitor coupled in parallel to the turn-off rectifier with a cathode of the GTO being coupled to a second side of the turn-on capacitor and a first side of the turn-off capacitor; and a turn-off MCT having a gate coupled to the MOS gate driver, an anode coupled to the source of the MOSFET and a cathode coupled to a second side of the turn-off capacitor. In an alternative embodiment the circuit includes a turn-off rectifier; a turn-off capacitor coupled in parallel to the turn-off rectifier; and a turn-off MCT having a gate coupled to the MOS gate driver, an anode coupled to one side of the turn-off capacitor, and a cathode coupled the cathode of the GTO. Either embodiment may further include a detection logic unit for evaluating the current to monitor for GTO failure conditions or for modulating the current for information transfer to the MOS gate driver.

5 Claims, 4 Drawing Sheets

GTO GATE DRIVER CIRCUITS FOR SNUBBERED AND ZERO VOLTAGE SOFT SWITCHING CONVERTERS

BACKGROUND OF THE INVENTION

The reliability of high power GTOs (gate turn-off thyristers) depends upon the corresponding GTO gate drivers which include numerous circuit elements such as power supplies, sensors, logic circuits, and high current MOSFET (metal oxide semiconductor field effect transistor) or thyristor drivers. Typically, the turn-on and turn-off characteristics of high current, high voltage GTO gate drivers require a power supply with four independently controlled output voltages.

GTO gate drivers that are used in conventional snubbered inverter circuits experience high losses both at turn-on and turn-off. To optimize GTO performance, a conventional technique is to turn on the GTO with a temporarily high current pulse. For example, a 3000 amp, 2500 volt GTO is typically turned on with a 40 amp pulse for 30 microseconds followed by a holding current, which can be 4 amps at room temperature or 10 amps at –40° C. A separate power supply with separate characteristics is used for each stage. The high current portion is delivered from a power supply that has a low transient impedance with sufficient energy storage to provide the turn-on charge. The holding current portion is derived from a power supply that has current control (high internal impedance) through a resistive drop, linear regulation, or PWM (pulse width modulation) switching circuits. The resistor and linear regulation of the high current portion is lossy (80 to 100 watts) but can be fabricated with simple controls. The PWM switcher is efficient (5 to 10 watts) but requires more controls and an additional inductor. Logic circuits and low power gate drivers that coordinate the gate driver turn-on switches (usually two low voltage MOSFETs that are in series with each power supply and the GTO gate lead) are needed to supply the turn-on currents to the gate of the GTO.

The turn-off process of high current GTOs includes a negative current pulse through the gate that is approximately one third of the anode-cathode current ($I_{ak}$). For example, a 3000 amp GTO can use a negative current pulse that is 1000 amps peak with a controlled current drop rate of 30 to 50 amps per microsecond. The maximum allowable steady state negative gate voltage is usually lower than 20 volts. The negative power supply must be designed with an ultra low internal impedance over the entire temperature range. In one embodiment, the design includes up to four MOSFETs in parallel for the gate driver turn-off switch. For safety reasons the charge stored in a buffer capacitor of the power supply is designed to be large enough such that the GTO can be turned off after power to the gate driver power supply is lost. Consequently, the power supply requires in-rush current limiting circuits during start-up to prevent overvoltages that could damage the MOSFETs and other elements. The limiting circuits typically comprise another MOSFET with charging resistors and control logic. Additionally, the four MOSFETs are typically capable of turning off the steady state shorting current in case the GTO gate fails to prevent fire in the gate driver and damage to other GTO gate drives that are fed from the same power supply.

The power to each GTO gate driver is delivered through individual high voltage isolation transformers. High frequency power supplies capable of switching at 25 to 50 kHz are generally used. Furthermore, most gate drivers provide an optical coupled status flag that signals a main converter controller that all GTO driver parts and power supplies are functional, creating the need for many sensors and logic circuits. In some cases the temperature of the GTO and its turn-off performance are detected by modulating or coding the status flag.

Therefore, designing a GTO gate driver is a complex task, and most GTO gate drivers are very expensive circuits. Because of the complexity and number of components, reliability is a concern. Even a short failure of the logic circuits or a sensor on the GTO driver board renders the entire GTO driver unusable because all subcircuits are fed from the same power supply which presents a single point failure system.

SUMMARY OF THE INVENTION

The GTO gate driver of the present invention requires less components than conventional GTO gate drivers and can be produced at a lower cost with increased reliability.

In the present invention all sensing is performed from the main controller in parallel with the GTO gate driver power supplies (thus preventing driver failure when the circuits of a sensor create a short), power supplies having intrinsic current limiting properties are used, logic functions are eliminated, and primary power supply current patterns are used to diagnose proper GTO gate driver operation.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
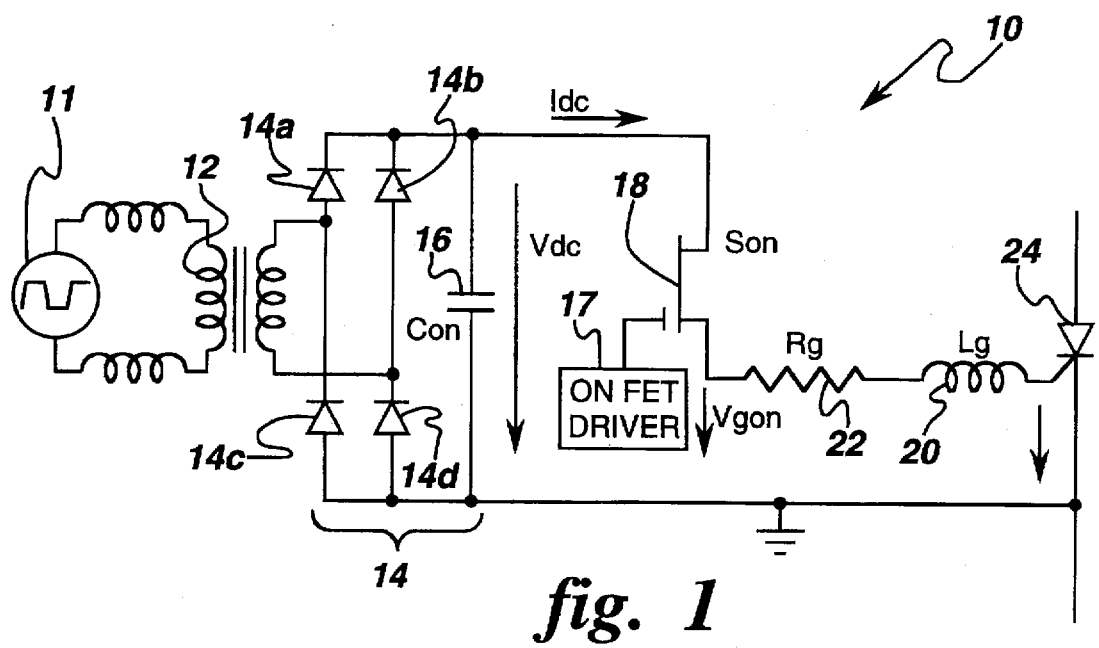
FIG. 1 is a circuit diagram illustrating a GTO gate driver turn-on circuit of the present invention.

FIG. 1 is a schematic view of a GTO gate driver turn-on circuit 10 of the present invention which can be used to drive both soft-switching and snubbered GTO devices. GTO gate drive turn-on circuit 10 can deliver a large initial (porch) current by proper selection of the open circuit voltage Vdc, the capacitance $C_{on}$ of a dc bus capacitor 16, and the turn-on MOSFET 18 ($S_{on}$) characteristics, as described below.

A high frequency power supply 11 including a square wave chopper supplies voltage to a high voltage isolation transformer 12 (T) which either has a built-in inductance or has a series inductance on the primary or secondary side. The secondary windings of the isolation transformer are connected to a diode H-bridge rectifier 14 (having diodes 14a, 14b, 14c, and 14d) that is connected to dc bus capacitor 16. A dc to dc converter circuit is thus created.

Figure 2:
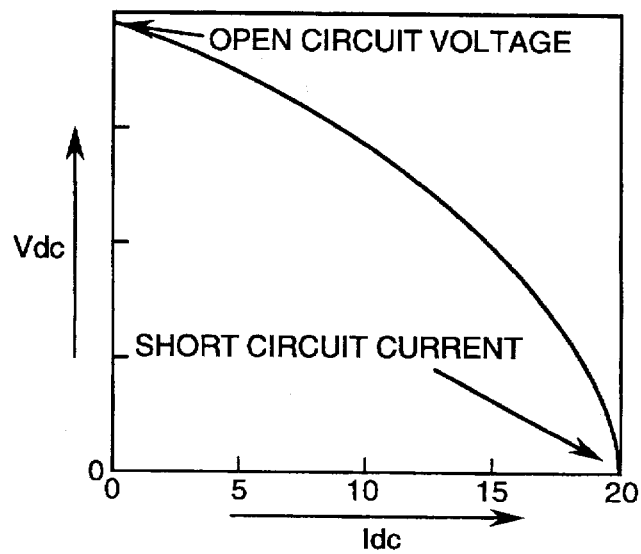
FIG. 2 is a graph illustrating a typical dc to dc converter output signal characteristic of the circuit diagram of FIG. 1.

The dc to dc converter has a natural short circuit current limiting characteristic, as shown in the graph FIG. 2, which is generated under the same conditions as described in DeDoncker et al., U.S. Pat. No. 5,027,264, issued Jun. 25, 1991. The turn-on power supply can use a relatively small dc capacitor for capacitor 16 (less than about 100µ farads) that is designed to supply the fast initial current rise and some filtering of the output current when the current reaches its steady state short circuit current. The steady state current equals the holding current of the GTO gate. The stray inductance of the transformer can be selected such that, in short circuit (or near short circuit) conditions, the supply current equals the required holding current for the lowest temperature operation of the GTO (typically 10 amps at −40°C). The output voltage at no-load is selected such that diagnostic circuits can be fed from the same supply and that dc capacitor 16 can store efficient energy for the initial porch current. The turn-on MOSFET 18 is in series with lead stray inductance 20 (Lg) and resistor 22 (Rg). In one embodiment inductance 20 is 300 nanohenrys and the resistance of resistor 22 is 0.2 ohms.

Thus, the MOSFET will initially apply a voltage across the inductance Lg and resistance Rg determined by the open circuit voltage of the supply. The level of this voltage and the value of capacitor 16 allow control over the di/dt at turn-on and the length of the initial porch current.

Large GTOs require high di/dt's and have gate leads with tuned stray inductance values, and therefore a discrete series inductance Lg can be avoided. The small series resistor 20, the open circuit voltage of the supply, and capacitor 16 allow the designer to select the peak value of the in-rush current in the GTO lead at turn-on. If the source-drain resistance of the MOSFET is large, series resistance 22 can be eliminated as well. Once the supply voltage Vdc drops (as current begins to flow), capacitor 16 discharges. Hence, the losses in the MOSFET (or the series resistance) are determined by the steady state current (typically ten amps) and not by the initial dc bus voltage.

Figure 3:
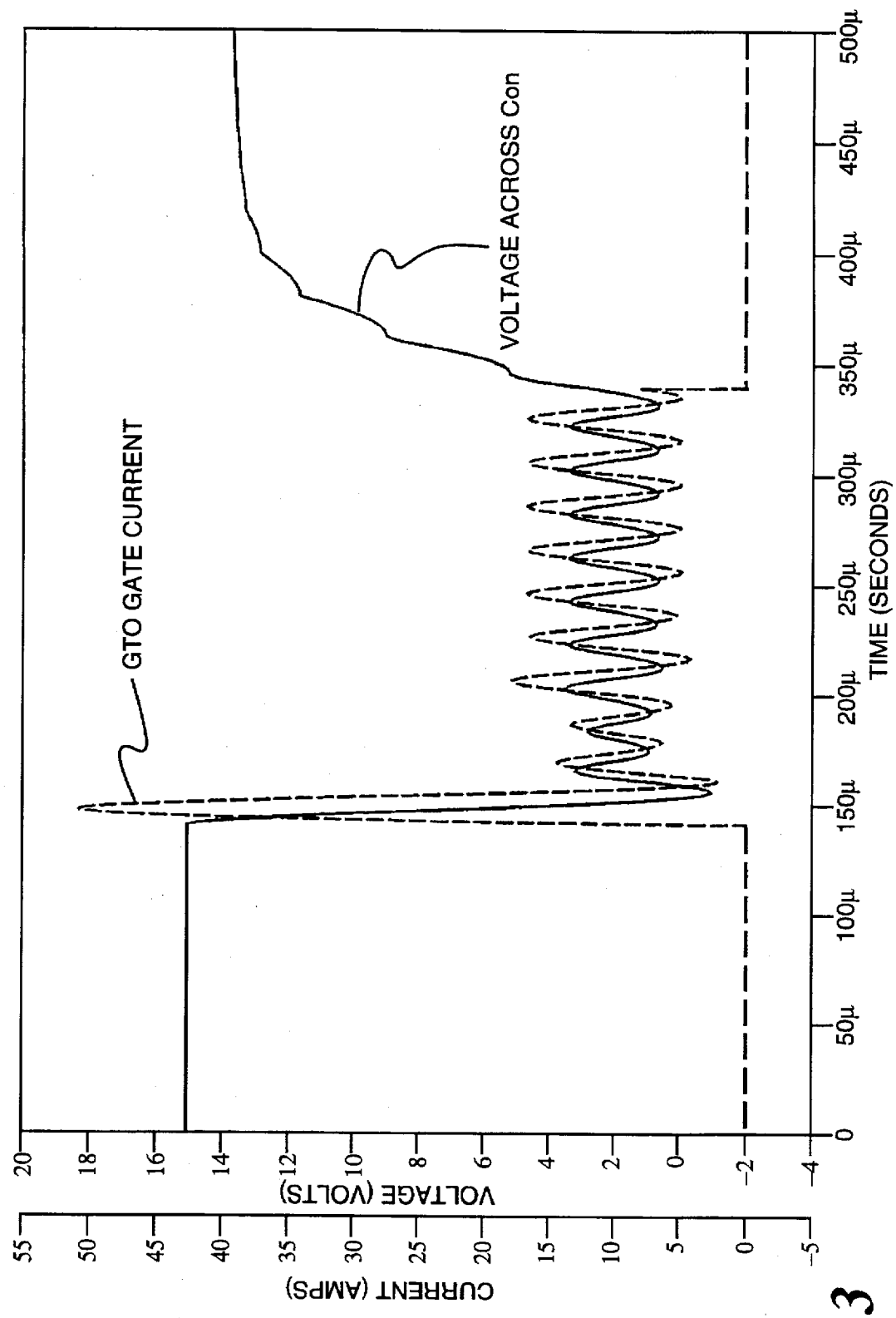
FIG. 3 is a graph illustrating simulated data of the GTO current and voltage over time.

Simulation data of the circuit shown in FIG. 1 is illustrated in FIG. 3. An initial period wherein the gate current is zero, i.e., in a turn-off condition, and the capacitor 16 voltage is high represents the initial condition which occurs before a gate turn-on signal is applied. Once the turn-on signal is given (turning on Son) the capacitor Con discharges into the GTO gate. The GTO turns on at this instant. The current provided by the turn-on circuit has a high frequency ripple (about twice the power supply switching frequency) which is somewhat filtered by the capacitor Con and the gate lead impedance Lg.

The gate of turn-on MOSFET 18 can be supplied with a driver 17 that is grounded with respect to the gate return lead of GTO 24. Hence, the turn-on MOSFET can be operated in a so-called source follower configuration. At turn-on, the MOSFET will apply a well-defined voltage across the inductance Lg and resistance Rg determined by its gate voltage Vgon. This feature decouples the selection of the open circuit voltage from the value of capacitor 16 because the energy of the capacitor is discharged into the GTO gate at a constant voltage, thus enabling selection of higher open circuit voltages and smaller capacitance values. The capacitance value must be sufficiently small to guarantee that the turn-on supply is reset quickly for the next turn-on occurrence.

Gate driver isolation transformer 12 enables soft switching operation of a high frequency (HF) (e.g., 25 kHz) ac supply generator (not shown) because the stray inductance of the isolation transformer can be used as a current limiting impedance. As a result, the ac input currents are always lagging, a feature which is the only requirement for soft switching of a square wave chopper. The lag feature provides a square wave generator that is easy to control (fixed 50% duty cycle), has lower EMI (electro-magnetic interference), and has high efficiency which enables higher ac frequencies (up to about 100 kHz).

Figure 4:
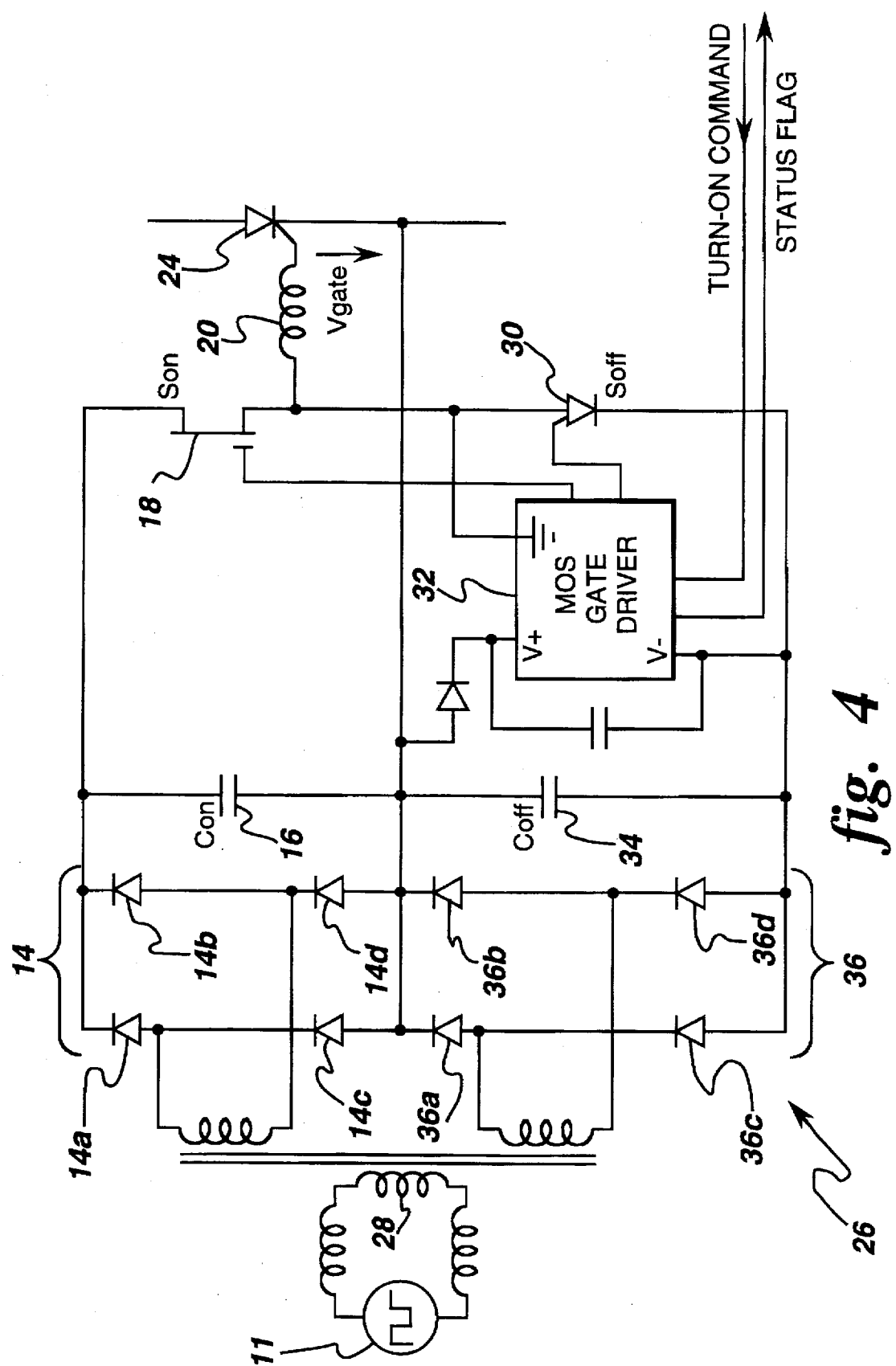
FIG. 4 is a circuit diagram similar to that of FIG. 1, further illustrating a GTO gate driver turn-off embodiment.

A turn-off circuit 26, shown in FIG. 4, is similar to the turn-on circuit and includes an H bridge rectifier 36 having diodes 36a, 36b, 36c, and 36d. The turn-off rectifier 36 is coupled to the turn-on rectifier 14. A high voltage isolation transformer 28 provides a positive supply to the turn-on circuit and a negative supply to the turn off circuit.

A dc capacitor 34 of the turn-off circuit is larger than the capacitor 16 of the turn-on circuit to support temporally large negative gate current pulses. In one embodiment of the gate driver, a p-channel MCT (MOSFET controlled thyristor) is used instead of the multiple parallel n-channel MOSFETs discussed above in the background section. Consequently, one single low power gate driver 32 can control both the switching of the turn-on MOSFET 18 and the turn-off MCT 30. In this embodiment, the turn-on MOSFET is not operating in a source follower mode. The control and driver circuitry of the gate driver can be referenced to the anode of the MCT, i.e., the gate lead of the GTO. If the GTO fails to turn-off, the gate current can remain large. In a similar manner as capacitor 16 of the turn-on circuit, capacitor 34 will first discharge, and then a total collapse of voltage provided by the negative power supply (due to the high stray inductance of the transformer) will occur to limit the maximum GTO gate current to a level that can safely be turned off by the MCT (about 120 amps at low voltage conditions for commercially available MCTs). The internal ac inductance of the negative supply transformer also limits the potential high in-rush current to the large dc capacitor, permitting the elimination of all in-rush current limiting devices.

Figure 5:
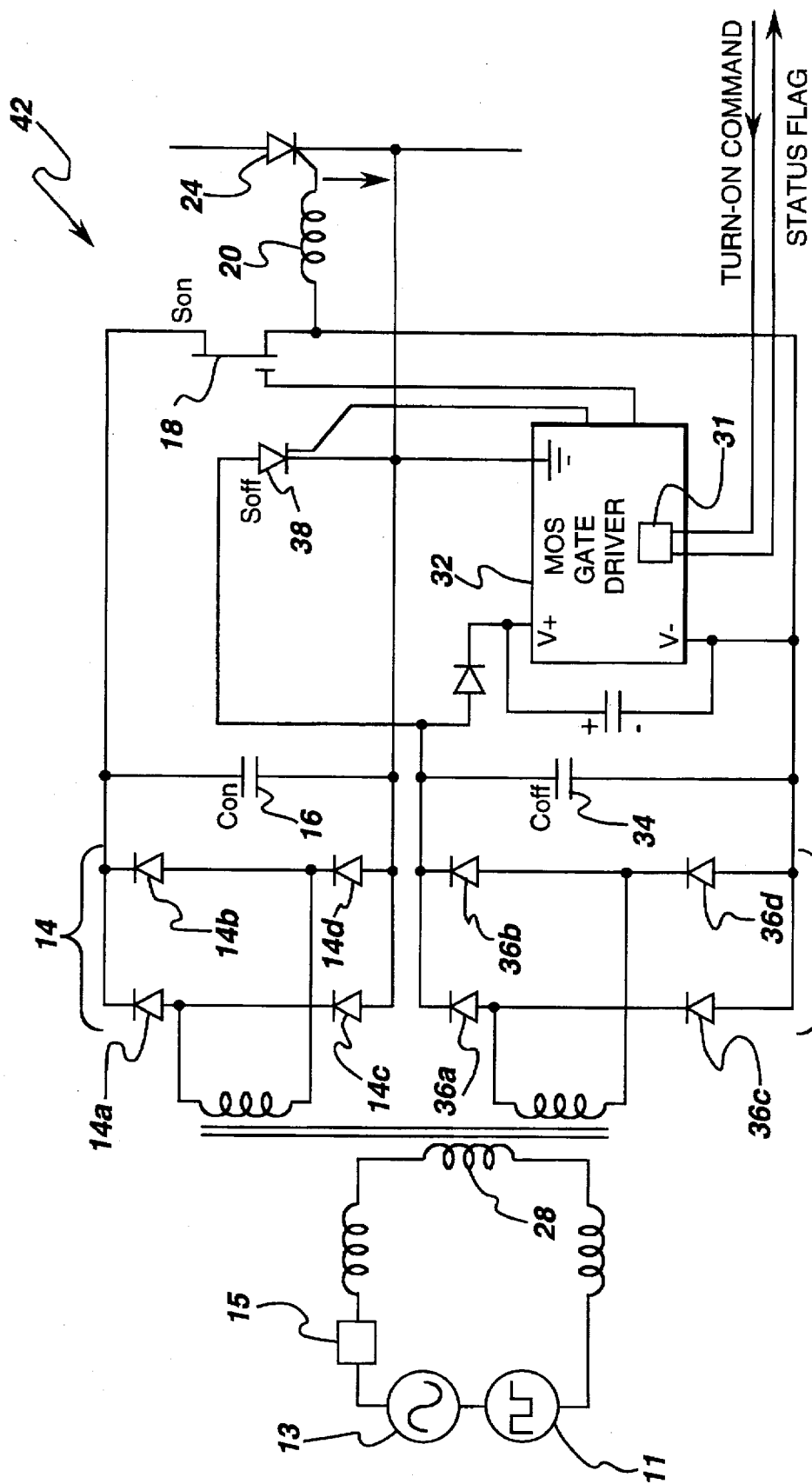
FIG. 5 is a circuit diagram similar to that of FIG. 1, further illustrating another GTO gate driver turn-off embodiment.

FIG. 5 is a view of another embodiment of a GTO driver 42 of the present invention in which respective turn-on and turn-off rectifiers 14 and 36 are not coupled, and the power supply for the turn-off portion of the circuit is floating with respect the power supply for the turn-on portion of the circuit. In this embodiment, a n-type turn-off device MCT 38 is used to accommodate the turn-off function, and the turn-on MOSFET 18 (also n-type) operates in a source follower mode.

The GTO gate driver circuit 42 comprises GTO 24; MOS gate driver 32; the turn-on rectifier 14 for receiving power from the high voltage isolation transformer 28; turn-on capacitor 16 coupled in parallel with the turn-on rectifier 14; and turn-on MOSFET 18 having a drain coupled to a first side of the turn-on capacitor 16, a gate coupled to the MOS gate driver 32, and a source coupled to a gate of the GTO 24. A cathode of the GTO 24 is coupled to a second side of the turn-on capacitor 16. The GTO gate driver circuit further includes a turn-off rectifier 36 for receiving power from high voltage isolation transformer 28; a turn-off capacitor 34 coupled in parallel to the turn-off rectifier 36; and a turn-off MCT 38 having a gate coupled to the MOS gate driver 32, an anode coupled to one side of the turn-off capacitor 34, and a cathode coupled the cathode of the GTO.

An optical transistor 31 of MOS gate driver 32 receives the turn-on and turn-off commands. The receiver can be fed from a +15 volt supply derived from the main supplies through linear regulators or a simple diode clamp (not shown). The dc capacitors 16 and 34 are large enough to support the +15 V during the on state of the GTO. If the GTO needs to be turned on indefinitely, either a separate winding on the transformer (not shown) can be used or a step-up charge pump converter (not shown) that derives its energy from the turn-off supply can be used. Charge pumps are presently available in many low cost gate drivers for MOS-gated power devices.

During the on-state, the current from high frequency power supply 11 increases significantly and can be detected at the primary side of the transformer. As a result, a current sensor 13 and detection logic unit 15 for all GTO gate drivers can be common in a HF power supply unit. The GTO gate driver supplies (not shown) do not need to feed power to these diagnostic logic units, a feature which further increases their reliability. During turn-off, the HF power supply current should be small. If the GTO gate has failed and shorted, then a large current will flow to the gate, signaling the HF power supply logic that the GTO failed. Again, it is not necessary with the proposed power supplies to build these diagnostic functions into the gate drivers themselves. The number of components can therefore be greatly reduced and the reliability of the circuit can thereby be improved.

In zero voltage switching converters, a zero voltage detector (ZVD) (not shown) is used to turn on the GTO under zero voltage conditions. A zero-voltage crossing detector for soft-switching devices is described in DeDoncker, U.S. Pat. No. 5,166,549, issued Nov. 24, 1992, for example. This circuit can send a status signal (optically coupled) back to a phase leg controller using an opto coupler LED in series with the ZVD. If the opto coupler is fed from the turn-on power supply the status flag includes two pieces of information: the GTO is at zero voltage and the GTO turn-on power supply is available. The turn-on process can then further be monitored by the HF ac supply current by current sensor 13 and detection logic unit 15, as discussed above. Other information on the GTO performance, e.g., temperature, can be transmitted back through parallel optical links, by modulation of the above mentioned status flag or by superimposing a modulated current signal on the HF power supplies. However, every attempt should be made to design the additional diagnostic circuits to be placed in parallel with the GTO power supplies such that they do not cause a GTO failure when they malfunction.

Zero voltage soft switching (ZVS) converters, such as the ARCP (auxiliary resonant commutated pole) converters described in DeDoncker et al., U.S. Pat. No. 5,047,913, issued Sep. 10, 1991, achieve zero turn-on switching losses by resonating the energy stored in resonant or snubber capacitors to zero volts using resonant or quasi-resonant LC circuits (not shown). At the instant zero voltage is reached, a silicon power switch can be turned on without an initial large current portion. As a result, ZVS GTO converters do not require gate drivers that provide a high initial turn-on current (they do however need zero voltage detection circuitry as described in aforementioned De Doncker, U.S. Pat. No. 5,166,549).

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A GTO (gate turn-off thyristor) gate driver circuit comprising:

a GTO;

a MOS (metal oxide semiconductor) gate driver a turn-on rectifier for receiving power from a high voltage isolation transformer;

a turn-on capacitor coupled in parallel with the turn-on rectifier;

a turn-on MOSFET (MOS field effect transistor) having a drain coupled to a first side of the turn-on capacitor, a gate coupled to the MOS gate driver, and a source coupled to a gate of the GTO, a turn-off rectifier coupled to the turn-on rectifier;

a turn-off capacitor coupled in parallel to the turn-off rectifier, a cathode of the GTO being coupled to a second side of the turn-on capacitor and a first side of the turn-off capacitor;

a turn-off MCT (MOSFET controlled thyristor) having a gate coupled to the MOS gate driver, an anode coupled to the source of the MOSFET and a cathode coupled to a second side of the turn-off capacitor;

a square wave chopper for supplying chopped voltage to the high voltage isolation transformer;

a current sensor coupled between the square wave chopper and the high voltage isolation transformer for detecting current in the high voltage isolation transformer; and a detection logic unit coupled to the current sensor for evaluating the current to monitor for GTO failure conditions.

2. A GTO (gate turn-off thyristor) gate driver circuit comprising:

a GTO;

a MOS (metal oxide semiconductor) gate driver a turn-on rectifier for receiving power from a high voltage isolation transformer;

a turn-on capacitor coupled in parallel with the turn-on rectifier;

a turn-on MOSFET (MOS field effect transistor) having a drain coupled to a first side of the turn-on capacitor, a gate coupled to the MOS gate driver, and a source coupled to a gate of the GTO, a turn-off rectifier coupled to the turn-on rectifier;

a turn-off capacitor coupled in parallel to the turn-off rectifier, a cathode of the GTO being coupled to a second side of the turn-on capacitor and a first side of the turn-off capacitor;

a turn-off MCT (MOSFET controlled thyristor) having a gate coupled to the MOS gate driver, an anode coupled to the source of the MOSFET and a cathode coupled to a second side of the turn-off capacitor;

a square wave chopper for supplying voltage to the high voltage isolation transformer; and a detection logic unit for modulating current in the high voltage isolation transformer for information transfer to the MOS gate driver.

3. A GTO (gate turn-off thyristor) gate driver circuit comprising:

a GTO;

a MOS gate driver;

a turn-on rectifier for receiving power from a high voltage isolation transformer;

a turn-on capacitor coupled in parallel with the turn-on rectifier;

a turn-on MOSFET having a drain coupled to a first side of the turn-on capacitor, a gate coupled to the MOS gate driver, and a source coupled to a gate of the GTO;

a cathode of the GTO being coupled to a second side of the turn-on capacitor;

a turn-off rectifier for receiving power from the high voltage isolation transformer;

a turn-off capacitor coupled in parallel to the turn-off rectifier; and a turn-off MCT having a gate coupled to the MOS gate driver, an anode coupled to one side of the turn-off capacitor, and a cathode coupled the cathode of the GTO.

4. The circuit of claim 3, further including:

a square wave chopper for supplying chopped voltage to the high voltage isolation transformer;

a current sensor coupled between the square wave chopper and the high voltage isolation transformer for detecting current in the high voltage isolation transformer; and a detection logic unit coupled to the current sensor for evaluating the current to monitor for GTO failure conditions.

5. The circuit of claim 3, further including:

a square wave chopper for supplying voltage to the high voltage isolation transformer; and a detection logic unit for modulating current in the high voltage isolation transformer for information transfer to the MOS gate driver.

* * * * *